United States Patent [19]
Yun et al.

[11] Patent Number: 5,883,050
[45] Date of Patent: Mar. 16, 1999

[54] HG-BASED SUPERCONDUCTING CUPRATE FILMS

[75] Inventors: Sang-Ho Yun, Huddinge, Sweden; Judy Z. Wu, Lawrence, Kans.

[73] Assignee: The University of Kansas, Lawrence, Kans.

[21] Appl. No.: 740,498

[22] Filed: Oct. 30, 1996

[51] Int. Cl.⁶ .............................. H01L 39/12; B32B 9/00
[52] U.S. Cl. ........................ 505/125; 505/120; 505/783; 505/785; 428/930
[58] Field of Search ..................................... 428/688, 930; 505/120, 125, 110, 239, 783, 785; 427/62

[56] References Cited

U.S. PATENT DOCUMENTS

| | | |
|---|---|---|
| 5,098,868 | 3/1992 | Wong et al. . |
| 5,242,897 | 9/1993 | Wong et al. . |
| 5,329,165 | 7/1994 | Kao et al. . |
| 5,332,721 | 7/1994 | Xin et al. . |
| 5,470,821 | 11/1995 | Wong et al. . |

OTHER PUBLICATIONS

Meng et al, Appl. Phys. Lett. 68(22), May 1996, pp. 3177–3179.

Singh et al, Physica C 262(1996) pp. 7–12.

Foong et al, Appl. Phys. Lett. 68(8), Feb. 1996, pp. 1153–1155.

Higuma et al, Appl. Phys. Lett. 65(6), 1994, pp. 743–745.

Yun et al.; Superconductivity above 130 K in high–quality mercury–based cuprate thin films; Appl. Phys. Lett. 68 (6), 5 Feb. 1996, pp. 862–864.

Yun et al.; Fabrication of c–oriented $HgBa_2Ca_2Cu_3O_{8+\delta}$ superconducting thin films; Appl. Phys. Lett. 67 (19),6 Nov. 1995, pp. 2866–2868.

Yun et al.; Growth of $HgBa_2Ca_2Cu_3O_{8+\delta}$ thin films on $LaAlO_3$ substrates using fast temperature ramping Hg–vapor annealing; Appl. Phys. Lett. 68 (18), 29 Apr. 1996, pp. 1–3.

Tsuei et al., Superconducting Mercury–Based Cuprate Films with a Zero–Resistance Transition Temperature of 124 Kelvin; Science, vol. 263, 4 Mar. 1994, pp. 1259–1261.

*Primary Examiner*—Roy V. King
*Attorney, Agent, or Firm*—Hovey, Williams, Timmons & Collins

[57] ABSTRACT

A Hg-based superconducting cuprate film on a substrate is disclosed, which comprises a compound having the formula $Hg_{1-x}M_xBa_2Ca_{n-1}Cu_nO_y$, M is a metal cation, x ranges from 0 to 1, n is an integer greater than 0, and y is an oxygen sufficiency factor having a value less than about 10.

5 Claims, 1 Drawing Sheet

HG-BASED SUPERCONDUCTING CUPRATE FILMS

BACKGROUND OF THE INVENTION

1. Field of the Invention

The present invention is broadly concerned with Hg-based superconducting cuprate films, and methods and apparatus for preparing the same. More particularly, the present invention relates to the "Fast Temperature Ramping Hg-Vapor Annealing" (FRTA) method for fabricating Hg-based superconducting cuprate films, an apparatus for transforming a superconducting film precursor into a superconductor by contacting the precursor with a metal cation-containing vapor, and resultant superconducting films.

2. Description of the Prior Art

Superconductivity, a phenomenon occurring at very low temperatures in many electrical conductors, occurs when electrons responsible for conduction undergo a collective transition to an ordered state. Many unique and remarkable properties result from this transition, including the vanishing of resistance to the flow of electric current, the appearance of a large diamagnetism and other unusual magnetic effects, substantial alteration of many thermal properties, and the occurrence of quantum effects otherwise observable only at the atomic and subatomic levels.

Superconductivity was discovered in 1911 by H. Kamerlingh Onnes while studying the variation with temperature of the electrical resistance of mercury within a few degrees of absolute zero. He observed that the resistance dropped sharply to an unmeasurably small value at a temperature of 4.2°K. The temperature at which this transition occurs is called the critical temperature ($T_c$).

Until recently, all known superconducting materials attained superconductivity at very low temperatures on the order of 4°–20° K. Such low temperatures had to be reached by evaporating liquid helium, the only substance that remains liquid at temperatures approaching absolute zero. The few sources of helium in nature and its expensive processing make it a costly cryogenic fluid. Thus, there is a need for materials which are superconductive at temperatures much higher than absolute zero.

Recently, superconductivity has been discovered in Hg-based cuprates ($HgBa_2Ca_{n-1}Cu_{n-1}O_{2n+2+\delta}$; n=1, 2, or 3), which raised the record for $T_c$ to 135° K. Consequently, many efforts have been devoted to the synthesis of high-quality Hg-based cuprate thin films. However, due to the high volatility and high toxicity of Hg and Hg-based compounds, the synthesis of such films is extremely difficult. In spite of these difficulties, advances have been achieved recently in growth of epitaxial Hg-based cuprate thin films.

Only (100) $SrTiO_3$ substrates have been used previously in the growth of the Hg-based cuprate thin films. However, while $SrTiO_3$ substrates have many superior properties including chemical stability in Hg vapor, they are expensive, are available only in small size, and have poor microwave properties such as high dielectric constant and high microwave tangent loss. It is thus necessary to find other lower-cost, large-size, and microwave-compatible substrates that can be used in the growth of Hg-based cuprate thin films.

One such substrate, $LaAlO_3$, is available in large size (e.g., a wafer having a diameter greater than 3 inches) at much lower cost than $SrTiO_3$, and has excellent microwave properties. Hg-based cuprate films on $LaAlO_3$ substrates have $T_c$'s nearly 20° K. lower than $T_c$'s obtained with Hg-based cuprate films on $SrTiO_3$ substrates, and have critical current densities ($J_c$'s) more than two orders of magnitude lower than $J_c$'s obtained with Hg-based cuprate films on $SrTiO_3$ substrates. Since the chemical stability of $LaAlO_3$ is not as good as that of $SrTiO_3$ at high temperatures in the presence of Hg vapor, chemical reactions and interdiffusion near the film/substrate interface seriously degrade the superconducting properties of the films. Thus, until now, only poor-quality Hg-based cuprate thin films have been obtained on $LaAlO_3$ substrates.

In the conventional annealing method previously used for Hg-based cuprates, the sample temperature is increased slowly (e.g., 4–6 hours) to the annealing temperature (e.g., 780°–860° C.) in order to maintain phase equilibrium between a precursor film and an unreacted $HgO+Ba_2Ca_{n-1}Cu_nO_y$ pellet which are sealed together in an evacuated quartz tube. Since HgO decomposes at around 500° C., two problems arise using this slow-heating cycle. First, at temperatures above 500° C., $Hg^{+2}$ begins to react with Ca to form $CaHgO_2$, a compound which seriously degrades the superconducting properties of the sample. Second, the high-temperature processing time (e.g., 500° C. to annealing temperature) increases the problem of film/substrate interface chemical reaction and interdiffusion. Consequently, only $HgBa_2CaCu_2O_{6+\delta}$ (i.e., Hg-1212) thin films have been obtained with the conventional method. No success has been reported with $HgBa_2Ca_2Cu_3O_{8+\delta}$ (i.e., Hg-1223) thin films because a relatively high annealing temperature is needed, making interfacing and $CaHgO_2$ problems more severe. Furthermore, only a $SrTiO_3$ substrate has been used in the conventional annealing method, with the resultant films having poor surface morphology.

Moreover, the conventional annealing method has not been successful in generating a high-quality double-sided superconducting film (a double-sided superconducting film is a composite comprised of a double-sided substrate having a superconducting film on each side thereof). Such double-sided superconducting films have many applications in microelectronics (e.g., superconducting quantum interference devices and microwave resonators). A double-sided superconducting film is conventionally prepared by depositing and annealing the first side of the film, and subsequently depositing and annealing the second side of the film.

Since most in-situ deposition methods utilize high deposition temperatures of approximately 750°–800° C., the superconducting properties of the first side of the film degrade when the first side is again heated during annealing of the second side of the film. Therefore, it is difficult to produce double-sided superconducting films with sides having identical physical properties. Differences between the first and second sides in double-sided superconducting films have hindered the application of high-temperature superconductors in the microelectronics industry.

SUMMARY OF THE INVENTION

The present invention is directed to a method (i.e., the FTRA method) for fabricating Hg-based superconducting cuprate films. The FTRA method overcomes the problems associated with prior-art methods by reducing the period of high-temperature annealing necessary to transform a precursor film into a superconductor. The FTRA method is used to fabricate single-sided and double-sided superconducting films, wherein each superconducting film comprises a compound having the formula $Hg_{1-x}M_xBa_2Ca_{n-1}Cu_nO_y$, M is a metal cation (i.e., a dopant), x ranges from 0 to 1, n is an integer greater than 0, and y is an oxygen sufficiency factor having a value less than about 10. The method comprises the steps of (a) enclosing in a vessel a first compound and a composite, wherein the first compound has the formula $Hg_{1-x}M_xBa_2Ca_{n-1}Cu_nO_y$, the composite includes a substrate having a precursor film on a surface thereof, and the precursor film comprises a second compound having the formula $M_xBa_2Ca_{n-1}Cu_nO_y$, (b) holding the vessel at a temperature of about 600° to 1000° C. for about 0.5 minute to 2.5 hours, (c) cooling the composite, (d) holding the composite at about 200° to 600° C. for about 8 to 40 hours in flowing oxygen, and (e) cooling the composite.

Preferred embodiments of the FTRA method are as follows: The method includes the additional step of enclosing in the vessel a third compound having the formula $M_xBa_2Ca_{n-1}Cu_nO_y$, The dopant is Pb, Tl, Re, or Na, n is 2 or 3, the substrate is $SrTiO_3$ or $LaAlO_3$, the first, second, and third compounds are in the form of self-sustaining bodies (e.g., cylindrical pellets), the vessel is an evacuated quartz tube, and the precursor film is placed in the vessel less than 1 mm (preferably 0.5 mm) from the first compound. In step (b), the vessel is held for about 1 to 60 minutes at a temperature of about 770° to 810° C. when n is 2, and at a temperature of about 800° to 870° C. when n is 3. The temperature in step (b) is reached using a heating rate of about 5 to 100° C. per minute (preferably about 40° to 50° C. per minute); when the precursor film has a thickness of 1 $\mu$m or less, the vessel is held at this temperature for about 25 to 35 minutes, and when the precursor film has a thickness greater than 1 $\mu$m, the vessel is held at this temperature for about 25 to 35 minutes, plus about an additional 10 to 20 minutes for every $\mu$m of thickness of the precursor film in excess of 1 $\mu$m. In step (c), the composite is cooled to a temperature below about 400° C. using a cooling rate of about 0.5 to 20° C. per minute (preferably about 2.5° to 50° C. per minute). In step (d), the composite is held at a temperature of about 375° to 425° C. for about 16 to 32 hours. The temperature in step (d) is reached using a rate of temperature change of about 2.5° to 40° C. per minute (preferably about 10° to 15° C. per minute). In step (e), the composite is cooled to room temperature using a cooling rate of about 0.5° to 20° C. per minute (preferably about 2.5° to 50° C. per minute).

The present invention is also directed to an apparatus for transforming a superconducting film precursor into a superconductor by contacting the precursor with a metal cation-containing vapor. The apparatus includes a self-sustaining body (e.g., a cylindrical pellet) having a slot capable of holding the precursor, and the self-sustaining body comprises a compound capable of generating the metal cation-containing vapor. The precursor is placed into the slot of the apparatus, and the apparatus/precursor is annealed, preferably using the FRTA method described above.

Preferred embodiments of the apparatus are as follows: The cation is Hg, Pb, or Tl, the self-sustaining body (e.g., a cylindrical pellet) comprises a compound having the formula $Hg_{1-x}M_xBa_2Ca_{n-1}Cu_nO_y$ wherein M is a cation (preferably Pb, Tl, Re, or Na), x ranges from 0 to 1, n is an integer greater than 0 (preferably 2 or 3), and y is an oxygen sufficiency factor less than about 10. The slot extends along the longitudinal axis (preferably along the entire length) of the self-sustaining body. The depth of the slot is equal to 0.8 r to 1.2 r, wherein r is the radius of the cylindrical pellet. When a composite comprising the precursor is placed within the slot, the clearance between the precursor and the slot is less than about 1 mm (preferably less than about 0.5 mm).

The present invention is also directed to two types of superconducting films, wherein each superconducting film has a thickness of at least about 50 Å (preferably about 0.2–2 $\mu$m). The first type of superconducting film comprises a compound having the formula $Hg_{1-x}M_xBa_2cA_{N-1}Cu_nO_y$, wherein M is a metal cation (preferably Pb, Tl, Re, or Na), x ranges from 0 to 1, n is 0, 1, or an integer greater than 2 (preferably 3), and y is an oxygen sufficiency factor less than about 10. The second type of superconducting film comprises a compound having the formula $Hg_{1-x}M_xBa_2CaCu_2O_y$, wherein M is a metal cation (preferably Pb, Tl, Re, or Na), x ranges from greater than 0 to 1, and y is an oxygen sufficiency factor less than about 10.

Finally, the present invention is directed to two types of composites, wherein each composite includes at least one superconducting film having a thickness of at least about 50 Å (preferably about 0.2–2 $\mu$m). The first composite comprises a substrate having a superconducting film on a surface thereof, wherein the substrate includes a compound having the formula $LaAlO_3$, and the superconducting film includes a compound having the formula $Hg_{1-x}M_xBa_2Ca_{n-1}Cu_nO_y$) wherein M is a metal cation (preferably Pb, Tl, Re, or Na), x ranges from 0 to 1, n is an integer greater than 0 (preferably 2 or 3), and y is an oxygen sufficiency factor less than about 10. The second type of composite comprises a nonsuperconducting substrate (preferably having the formula $SrTiO_3$ or $LaAlO_3$) and a pair of superconducting films, wherein the substrate presents a pair of opposing surfaces, and each of the superconducting films is on one of the substrate surfaces; preferably, each of the superconducting films comprises a compound having the formula $Hg_{1-x}M_xBa_2Ca_{n-1}Cu_nO_y$, wherein M is a metal cation (ideally Pb, Tl, Re, or Na), x ranges from 0 to 1, n is an integer greater than 0 (ideally 2 or 3), and y is an oxygen sufficiency factor less than about 10.

DETAILED DESCRIPTION OF THE PREFERRED EMBODIMENT

Figure 1:
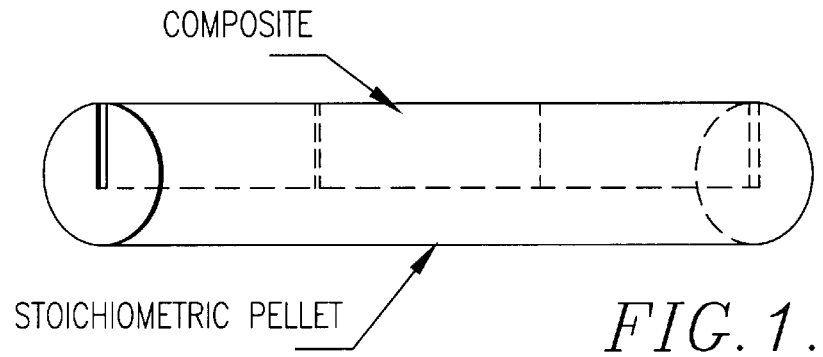
FIG. 1 is a schematic illustration of the preferred stoichiometric pellet used in the fabrication of superconducting films in accordance with the present invention, wherein the pellet contains a composite composed of a substrate having a precursor film on a surface thereof.

The following examples illustrate the FRTA method for fabricating Hg-based superconducting cuprate films, an apparatus for transforming a superconducting film precursor into a superconductor by contacting the precursor with a metal cation-containing vapor, and resultant superconducting films. These examples are set forth by way of illustration only, and nothing therein shall be taken as a limitation upon the overall scope of the invention.

EXAMPLE 1

FTRA Method for Fabricating Hg-1212 and Hg-1223 Thin and Thick Films

The FTRA method is a three-step method for fabricating Hg-based superconducting cuprate thin and thick films. The three steps are (1) deposition of Hg-free, rare-earth copper precursor films; (2) high-temperature Hg-vapor annealing; and (3) low-temperature oxygen-vapor annealing. These steps are described in detail below.

Step 1: Deposition of Hg-free rare-earth copper precursor films.

Since moisture and carbon contamination are detrimental to the formation of Hg-based superconducting films, target preparation was conducted in a plastic bag filled with pure argon gas. Targets were prepared from $Ba(NO_3)_2$, CaO, and CuO powders. Nominal target compositions of Ba:Ca:Cu= 2:1:2 and 2:2:3 were used in the fabrication of Hg-1212 films and Hg-1223 films, respectively. Each target was prepared by mixing the oxide powders in the expected nominal proportions. The mixture was then sintered at 900° C. for 17 hours in an oxygen atmosphere to eliminate moisture and carbonates. The sintered mixture was reground, and the resultant powder was pressed into a 2-inch-diameter, 0.25-inch-thick disk using 50 tons of pressure. The disk was then baked at 900° C. for 17 hours in an oxygen atmosphere. To prepare precursor pellets used in the deposition method (see below), the powder was pressed into cylindrical pellets rather than disks. Each precursor pellet had a length of 7–9 mm, a diameter of approximately 6 mm, and a mass of approximately 3 g. These pellets were also baked at 900° C. for 17 hours in an oxygen atmosphere.

Each precursor film was deposited on a $SrTiO_3$ or $LaAlO_3$ substrate from the target to form a composite. Although precursor films were routinely prepared by radio-frequency magnetron sputtering using a 2-inch sputtering gun, precursor films may be deposited using any existing thin- or thick-film deposition technique including (1) physical-vapor deposition (e.g., pulsed-laser deposition, magnetron sputtering, and electron-beam deposition), and (2) chemical-vapor deposition (e.g., metal-organic chemical-vapor deposition).

Before target deposition, the deposition chamber was pumped down to a pressure of $10^{-6}$ Torr, flushed with pure argon gas, and again pumped down to a pressure of $10^{-6}$ Torr. The chamber was then filled with pure argon to a pressure of approximately 50 mTorr. The target was pre-sputtered for 0.5 hour before the actual deposition to remove the surface layer from the target. The substrate was mounted in an on-axis configuration relative to the sputtering gun. Sputtering was conducted at room temperature. The sputtering rate was approximately 200 nm/hour as determined using a cross-sectional scanning electron microscopy technique. A one- or two-hour deposition time was usually used for thin films, while a longer time was used for thick films. Precursor films having a thickness of between 0.2–2 $\mu$m were fabricated. The chemical composition of each precursor film was found to be within 10% of the nominal composition of the target as determined using an energy-dispersive x-ray spectroscopy technique. The composites were stored in a dry box immediately after being removed from the deposition chamber to avoid contamination by air. The precursor films were uniform, stoichiometric (except for Hg content), and free of contamination.

Step 2: High-temperature Hg-vapor annealing.

The precursor films deposited as described in Step 1 were amorphous and insulating, and therefore were annealed at high temperature to become epitaxial and superconducting. The Hg-based superconducting phase was formed during Hg-vapor annealing through a solid/vapor reaction between the rare-earth, copper precursor (i.e., $Ba_2Ca_{n-1}Cu_nO_y$; in these examples, n=2 or 3, and y is an oxygen sufficiency factor less than about 10) and Hg vapor. Hg vapor was generated from stoichiometric pellets composed of $HgBa_2Ca_1Cu_2O_y$ and $HgBa_2Ca_2Cu_3O_y$ to obtain Hg-1212 films and Hg-1223 films, respectively. Stoichiometric pellets were prepared in a nitrogen or argon dry box in order to reduce the chance of air contamination. Each stoichiometric pellet was prepared from $Ba(NO_3)_2$, CaO, and CuO powders mixed in the expected nominal proportions (i.e., Ba:Ca:Cu= 2:2:3 and 2:1:2 for $HgBa_2Ca_2Cu_3O_y$ and $HgBa_2Ca_1Cu_2O_y$, respectively), Each mixture was sintered at 930° C. Sintered $Ba_2Ca_1Cu_2O_Y$ or $Ba_2Ca_2Cu_3O_y$ powder was then mixed with HgO powder in a 1:1 nominal ratio, and the resultant mixture was pressed into a cylindrical pellet having a length of 7–9 mm, a diameter of approximately 6 mm, and a mass of approximately 3 g.

Figure 2:
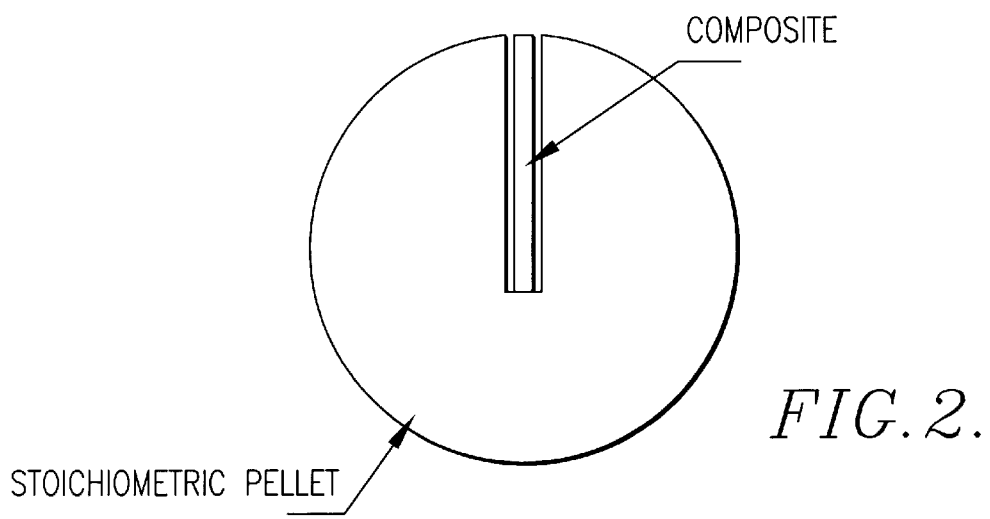
FIG. 2 is an end elevation view of the stoichiometric pellet/composite shown in FIG. 1.

Subsequently, a 1-mm-wide slot was cut into the stoichiometric pellet immediately after pressing it, and a composite including a substrate having a precursor film on a surface thereof was placed in this slot as illustrated in FIGS. 1 and 2. This orientation of the composite relative to the stoichiometric pellet was desirable in order to keep the precursor film very close to the stoichiometric pellet without touching it. Since the substrate was 0.5-mm thick, the distance between the precursor film and the stoichiometric pellet was estimated to be less than 0.5 mm. A precursor pellet and the stoichiometric pellet containing the composite were then torch encapsulated in a precleaned and evacuated quartz tube having an internal diameter of 7 mm and a length of 4 cm.

Figure 3:
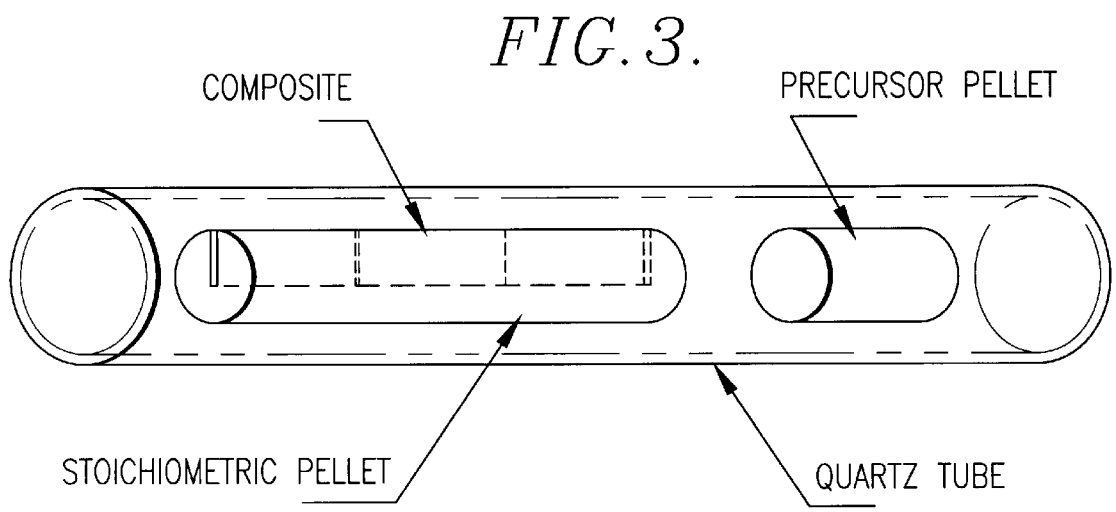
FIG. 3 is a schematic illustration of the preferred assembly used in the fabrication of superconducting films in accordance with the present invention, wherein the assembly includes a quartz tube having enclosed therein the stoichiometric pellet/composite shown in FIG. 1 and a precursor pellet.

The tube containing the precursor pellet, precursor film, and stoichiometric pellet, illustrated in FIG. 3, was then annealed at 780°–870° C. for less than 60 minutes. For Hg-1212 films, an annealing temperature of 790°–810° C. was used. For Hg-1223 films, an annealing temperature of 800°–870° C. was used. The typical annealing time for Hg-1212 and Hg-1223 films having a thickness of 1 $\mu$m or less was 30 minutes. A longer annealing time was required for thicker films, typically an additional 15 minutes for every additional $\mu$m of precursor-film thickness. An annealing period shorter than prior-art annealing periods was used in order to minimize the reaction of Hg vapor with the precursor film. A variety of heating rates were tested and correlated with sample superconducting properties, surface morphology, phase purity, and crystalline structures. Based on these results, it was found that a heating rate of approximately 20°–50° C./minute and a cooling rate of approximately 2.5°–5° C./minute provided the best-quality Hg-1212 and Hg-1223 films.

Step 3: Low-temperature oxygen-vapor annealing.

Since a short Hg-vapor annealing period was utilized, the resultant films were usually oxygen deficient. Low-temperature oxygen annealing was used to optimize the oxygen content in each film. In a typical annealing method for Hg-1212 and Hg-1223 films, the film was heated to 400° C. in 30 minutes in 1-atmosphere flowing oxygen, annealed at 400° C. for 24 hours, and cooled to room temperature naturally by turning the furnace off. Low-temperature oxygen annealing resulted in optimization of superconducting properties (e.g., $T_c$ and $J_c$) Table 1 lists the $T_c$'s of resultant Hg-1212 and Hg-1223 superconducting cuprate films obtained on $SrTiO_3$ and $LaAlO_3$ substrates. Additionally, $J_c$'s of approximately $3 \times 10^4$ A/cm$^2$ (at 100° K. and 0.5 Tesla magnetic field) and $2 \times 10^5$ A/cm$^2$ (at 112° K. and zero field) were obtained with single-sided Hg-1223 films on $SrTiO_3$ substrates.

EXAMPLE 2

Fabrication of Chemically Doped Hg-1212 and Hg-1223 Films

The FTRA technique was used to make several chemically doped Hg-based cuprate superconducting films using SrTiO$_3$ substrates. The purpose of chemical doping was to partially or completely replace specific elements in the cuprate with particular dopants. Benefits derived from chemical doping include modification of the physical properties of the cuprate (e.g., crystalline structure, T$_c$ and J$_c$), modification of thermodynamics of the original phase, and ease of processing. Doping of Hg-based cuprates can be carried out either by high-temperature dopant-vapor annealing or by incorporating the dopant directly into the precursor sputtering target. The fabrication of Hg-based cuprate superconducting films doped with Pb, Tl, Re, or Na is described below. These films were prepared by generally using the methods described in Example 1, with modifications of these methods being noted below.

Pb- and Tl-doped Hg-1212 and Hg-1223 Films.

Many compounds containing Pb and Tl are volatile. Since these compounds have relatively low vaporization temperatures, the incorporation of Pb or Tl into precursor films was accomplished through a solid/vapor reaction between the precursor material and Pb or Tl vapor. Therefore, the same targets and precursor pellets used in the preparation of undoped Hg-based superconductors described in Example 1 were used in the fabrication of Hg$_{1-x}$Pb$_x$Ba$_2$Ca$_{n-1}$Cu$_n$O$_y$ (Pb-doped) and Hg$_{1-x}$Tl$_x$Ba$_2$Ca$_{n-1}$Cu$_n$O$_y$ (Tl-doped) superconducting films.

The preparation of stoichiometric pellets containing Hg and Pb or Tl was similar to the preparation of undoped stoichiometric pellets described in Example 1. Hg:Pb(or Tl):Ba:Ca:Cu nominal ratios of 1-x:x:2:1:2 and 1-x:x:2:2:3 were used in the fabrication of Hg$_{1-x}$Pb(or Tl)$_x$-1212 and Hg$_{1-x}$Pb(or Tl)$_x$-1223 films, respectively. The starting materials for Pb and Tl were PbO and Tl$_2$O$_3$, respectively. Each stoichiometric pellet was prepared from powders of HgO, PbO or Tl$_2$O$_3$, and sintered Ba$_2$Ca$_1$Cu$_2$O$_y$ or Ba$_2$Ca$_2$Cu$_3$O$_y$.

Each quartz tube containing a precursor pellet, stoichiometric pellet, and composite including a substrate and precursor film was subsequently annealed at 770°–870° C. for 60 minutes or less. For Hg$_{1-x}$Pb$_x$-1212 films, an annealing temperature of 770°–800° C. was used. For Hg$_{1-x}$Pb$_x$-1223 films, an annealing temperature of 800°–850° C. was used, with an annealing temperature of 820° C. being optimum.

Re- and Na-doped Hg-1212 and Hg-1223 Films.

For the fabrication of Hg$_{1-x}$Re$_x$Ba$_2$Ca$_{n-1}$Cu$_n$O$_y$ (Re-doped) and Hg$_{1-x}$Na$_x$Ba$_2$Ca$_{n-1}$Cu$_n$O$_y$ (Na-doped) superconducting films, the dopants were incorporated directly into disk targets and precursor pellets. The starting materials for Re and Na were Re$_2$O$_7$ and NaCl, respectively. These starting materials were mixed directly with the oxide powders used in the preparation of disk targets and precursor pellets. Re(or Na):Ba:Ca:Cu nominal ratios of x:2:1:2 and x:2:2:3 were used in the fabrication of Hg$_{1-x}$Re(or Na)$_x$-1212 and Hg$_{1-x}$Re(or Na)$_x$-1223 films, respectively. Each mixture of powders was sintered at 930° C., and each disk or cylindrical pellet was baked at 930° C. The stoichiometric pellets were identical to those described in Example 1, except that the amount of Hg was reduced from 1 to 1-x. Table 1 lists the T$_c$'s of resultant Pb, Tl, Re, and Na-doped Hg-1212 and Hg-1223 superconducting cuprate films obtained on SrTiO$_3$ and LaAlO$_3$ substrates.

EXAMPLE 3

Fabrication of Double-sided Hg-1212 and Hg-1223 Films

The composite-containing stoichiometric pellet illustrated in FIGS. 1 and 2 was symmetrical relative to the two sides of the composite. Because of this configuration, the stoichiometric pellet/composite was suited for simultaneous Hg-vapor annealing of a double-sided composite containing two precursor films, wherein a precursor film was located on each surface of a double-sided substrate.

Precursor films were simultaneously deposited on both sides of a substrate using two sputtering guns in a face-to-face configuration. Alternatively, precursor films were individually deposited on both sides of a substrate using a single sputtering gun. Both SrTiO$_3$ and LaAlO$_3$ substrates were used. Each double-sided composite was placed in the slot of the stoichiometric pellet such that the sides of the composite were the same distance from the walls of the slot. Annealing was conducted as described in Example 1, except that the evacuated quartz tube containing a precursor pellet and the stoichiometric pellet/double-sided composite was annealed at a temperature of 780°–870° C. for 30–60 minutes. The resultant double-sided superconducting films had a T$_c$ of approximately 110°–120° K. on each side. The T$_c$ was further increased to approximately 124°–135° K. after 24-hour oxygen annealing at 300°–400° C. Table 1 lists the T$_c$'s of resultant Hg-1212 and Hg-1223 double-sided superconducting cuprate films obtained on SrTiO$_3$ and LaAlO$_3$ substrates.

TABLE 1

Hg-based superconducting cuprate films[1] fabricated using the FTRA process of the present invention.

| Film Type (Hg-based) | Dopant | Substrate | Sidedness | T$_c$ (°K.) |
|---|---|---|---|---|
| 1212 | none | SrTiO$_3$ | single | 125 |
| 1212 | none | LaAlO$_3$ | single | 124 |
| 1223 | none | SrTiO$_3$ | single | 130 |
| 1223 | none | LaAlO$_3$ | single | 128 |
| 1212 | Pb | SrTiO$_3$ | single | 123 |
| 1212 | Pb | LaAlO$_3$ | single | 123 |
| 1223 | Pb | SrTiO$_3$ | single | 129 |
| 1223 | Pb | LaAlO$_3$ | single | 127 |
| 1212 | Tl | SrTiO$_3$ | single | 124 |
| 1212 | Tl | LaAlO$_3$ | single | 124 |
| 1223 | Tl | SrTiO$_3$ | single | 131 |
| 1223 | Tl | LaAlO$_3$ | single | 130 |
| 1212 | Re | SrTiO$_3$ | single | 122 |
| 1212 | Re | LaAlO$_3$ | single | 122 |
| 1223 | Re | SrTiO$_3$ | single | 128 |
| 1223 | Re | LaAlO$_3$ | single | 126 |
| 1212 | Na | SrTiO$_3$ | single | 125 |
| 1212 | Na | LaAlO$_3$ | single | 124 |
| 1223 | Na | SrTiO$_3$ | single | 135 |
| 1223 | Na | LaAlO$_3$ | single | 133 |
| 1212 | none | SrTiO$_3$ | double | 124 |
| 1212 | none | LaAlO$_3$ | double | 124 |
| 1223 | none | SrTiO$_3$ | double | 128 |
| 1223 | none | LaAlO$_3$ | double | 127 |

[1]The structure of all superconducting films was c$_\perp$.

We claim:

1. A superconducting film on a substrate comprising a compound having the formula Hg$_{1-x}$M$_x$Ba$_2$Ca$_{n-1}$Cu$_n$O$_y$, wherein M is a metal cation, x ranges from 0 to 1, n is 1, or an integer greater than 2, and y is an oxygen sufficiency factor less than about 10.

2. The superconducting film of claim 1, wherein M is selected from the group consisting of Pb, Tl, Re, and Na.

3. The superconducting film of claim 1, wherein n is 3.

4. The superconducting film of claim 1, wherein the superconducting film has a thickness of at least about 50 Å.

5. The superconducting film of claim 4, wherein the superconducting film has a thickness of about 0.2–2 μm.

* * * * *